United States Patent
Blomquist et al.

(10) Patent No.: US 9,134,612 B2
(45) Date of Patent: Sep. 15, 2015

(54) PRINTING FORM PRECURSOR HAVING ELASTOMERIC CAP LAYER AND A METHOD OF PREPARING A PRINTING FORM FROM THE PRECURSOR

(71) Applicant: E I DU PONT DE NEMOURS AND COMPANY, Wilmington, DE (US)

(72) Inventors: Robert M Blomquist, River Edge, NJ (US); John Stephen Locke, Hockessin, DE (US); Chi W Chiu, Freehold, NJ (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 13/788,589

(22) Filed: Mar. 7, 2013

(65) Prior Publication Data

US 2013/0255513 A1    Oct. 3, 2013

Related U.S. Application Data

(60) Provisional application No. 61/616,199, filed on Mar. 27, 2012.

(51) Int. Cl.
| | |
|---|---|
| *G03F 7/00* | (2006.01) |
| *G03F 7/12* | (2006.01) |
| *G03F 1/00* | (2012.01) |
| *G03F 7/095* | (2006.01) |
| *G03F 7/11* | (2006.01) |

(52) U.S. Cl.
CPC *G03F 7/12* (2013.01); *G03F 1/003* (2013.01); *G03F 7/095* (2013.01); *G03F 7/11* (2013.01)

(58) Field of Classification Search
CPC ........ G03F 1/00; G03F 2007/00; B41M 1/00; B41M 99/00; B41M 2005/00; B41M 2205/14; B41C 1/055; Y10S 430/16
USPC ............. 430/138, 270.1, 271.1, 281.1, 283.1, 430/284.1; 101/450.1, 453, 463.1
See application file for complete search history.

(56) References Cited

U.S. PATENT DOCUMENTS

| | | |
|---|---|---|
| 4,047,963 A | 9/1977 | Simpson |
| 4,137,081 A | 1/1979 | Pohl |
| 4,323,637 A | 4/1982 | Chen et al. |
| 4,427,759 A | 1/1984 | Gruetzmacher et al. |
| 4,460,675 A | 7/1984 | Gruetzmacher et al. |
| 4,579,806 A | 4/1986 | Schupp et al. |
| 4,894,315 A | 1/1990 | Feinberg et al. |
| 5,262,275 A | 11/1993 | Fan |
| 5,292,617 A | 3/1994 | Feinberg et al. |
| 5,607,814 A | 3/1997 | Fan et al. |
| 5,798,202 A | 8/1998 | Cushner et al. |
| 5,804,353 A | 9/1998 | Cushner et al. |
| 5,888,697 A | 3/1999 | Fan |
| 5,888,701 A | 3/1999 | Fan |
| 6,238,837 B1 | 5/2001 | Fan |
| 6,492,095 B2 | 12/2002 | Samworth |
| 6,558,876 B1 | 5/2003 | Fan |
| 6,737,216 B2 | 5/2004 | Kannurpatti et al. |
| 6,773,859 B2 | 8/2004 | Fan et al. |
| 6,935,236 B2 | 8/2005 | Hiller et al. |
| 2003/0085384 A1* | 5/2003 | Burnell-Jones .......... 252/301.36 |
| 2003/0140805 A1 | 7/2003 | Hertzog |
| 2003/0180655 A1 | 9/2003 | Fan et al. |
| 2004/0146806 A1 | 7/2004 | Roberts et al. |
| 2004/0234886 A1 | 11/2004 | Rudolph et al. |
| 2006/0063109 A1 | 3/2006 | Choi et al. |
| 2007/0249778 A1* | 10/2007 | Clemens et al. ............. 524/502 |
| 2010/0086751 A1* | 4/2010 | Kannurpatti ............... 428/195.1 |
| 2010/0143841 A1 | 6/2010 | Stolt et al. |
| 2010/0167209 A1 | 7/2010 | Zwadlo et al. |
| 2010/0201039 A1 | 8/2010 | Leenders et al. |
| 2012/0048133 A1* | 3/2012 | Burberry et al. ............... 101/395 |

FOREIGN PATENT DOCUMENTS

| | | | |
|---|---|---|---|
| EP | 1072953 A1 | 1/2001 | |
| EP | 1239329 A2 * | 9/2002 | ............... G03F 7/095 |
| EP | 1457823 A2 * | 9/2004 | ................ G03F 7/09 |
| WO | 03/079114 A1 | 9/2003 | |

OTHER PUBLICATIONS

International Search Report, PCT/US2013/031860 Dated Oct. 8, 2013.
Non-Final Office Action dated May 21, 2014, U.S. Appl. No. 13/788,589.
Non-Final Office Action dated Jan. 21, 2015, U.S. Appl. No. 13/788,589.

\* cited by examiner

*Primary Examiner* — Chanceity Robinson

(57) ABSTRACT

The invention pertains to a printing form precursor, a method of preparing a printing form from the precursor, and a process of preparing the precursor. The printing form precursor includes a photopolymerizable layer, an elastomeric layer having at least an elastomeric binder and particulate, and an actinic radiation opaque material on, adjacent, or disposed above the elastomeric layer opposite the photopolymerizable layer. The particulate is selected from specific material particles having an average diameter from 1 to 10 micron and a refractive index that is within 0.04 units of an index of refraction of the composition forming the elastomeric layer.

17 Claims, No Drawings

PRINTING FORM PRECURSOR HAVING ELASTOMERIC CAP LAYER AND A METHOD OF PREPARING A PRINTING FORM FROM THE PRECURSOR

BACKGROUND OF THE INVENTION

1. Field of the Disclosure

This invention pertains to a printing form precursor and a method for preparing a printing form from the precursor, and in particular to a photosensitive printing form precursor having an elastomeric cap layer containing particulate and a method for preparing to form the printing form with a relief surface.

2. Description of Related Art

Flexographic printing plates are widely used for printing of packaging materials including corrugated carton boxes, cardboard boxes, continuous web of paper, and continuous web of plastic films. Flexographic printing plates are a form of relief printing in which ink is carried from a raised-image surface and transferred to a substrate. Flexographic printing plates can be prepared from photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a solid layer of the photopolymerizable composition interposed between a support and a coversheet or a multilayer cover element. The multilayer cover element includes a layer of an elastomeric composition, i.e., an overcoat layer, that is adjacent and in contact with the bulk photopolymerizable layer as disclosed by Grutzmacher et al. in U.S. Pat. No. 4,427,749.

Flexographic printing forms are characterized by their ability to crosslink or cure upon exposure to actinic radiation. Typically, the printing form precursor is uniformly exposed through its backside, i.e., backflashed, to a specified amount of actinic radiation to form a floor, and is imagewise exposed through its front side with the same actinic radiation that was used for the backflash exposure. Imagewise exposure can be through an image-bearing art-work or a phototool, such as a photographic negative or transparency (e.g. silver halide film), that is held in intimate contact under vacuum to the photopolymerizable layer, so called analog workflow. Alternatively, imagewise exposure can be through an in-situ mask having radiation opaque areas and clear areas that had been previously formed above the photopolymerizable layer, so called digital workflow. The precursor is exposed to actinic radiation, such as ultraviolet (UV) radiation, to selectively cure the photopolymerizable layer. The actinic radiation enters the photosensitive element through the transparent (or clear) areas and is blocked from entering the photopolymerizable layer by the black or opaque areas of the transparency or in-situ mask. The areas of the photopolymerizable layer, which are exposed to the actinic radiation, cure or hardened and crosslink. The unexposed areas of the photopolymerizable layer that were under the opaque regions of the phototool or in-situ mask during exposure do not crosslink or cure (i.e., harden). The uncured regions are soluble to solvents used during washout development and/or can melt, soften, or flow upon heating. The printing plate precursor is then subjected to a developing step wherein the unexposed areas (i.e., uncured areas) are removed by treating with a washout solution or heat leaving a relief surface with an image suitable for printing. If treated with washout solutions, the printing form or plate is subsequently dried to remove solvents that may be absorbed by the plate. The printing plate can be further exposed to UV radiation to ensure complete polymerization and to remove surface tackiness. After all desired processing steps, the plate or printing form is then mounted on printing press to print the formed relief image onto a substrate.

It is known by those skilled in the art that the presence of oxygen ($O_2$) during exposure in free-radical photopolymerization processes will induce a side reaction in which the free radical molecules react with the oxygen, while the primary reaction between reactive monomer molecules occurs. This side reaction is known as inhibition (i.e., oxygen inhibition) as it slows down the polymerization or formation of crosslinked molecules. Since in analog workflow there is intimate contact and a vacuum between the precursor and the phototool, imagewise exposure to actinic radiation occurs in the absence of oxygen so that the polymerization of the photopolymerizable material occurs at a rapid rate and generally matches the dimensions of the transparent areas of the mask, i.e., mask openings. Dots produced by analog workflow are typically conical and have a flat-top. However, because the opaque elements of the image-bearing artwork are separated by the negative film from the precursor, typically some loss of resolution occurs. Actinic radiation spreads between the phototool mask elements and the surface of the precursor and thereby limits the resolution that is possible.

An alternative to analog workflow is digital workflow, which does not require the preparation or use of a separate phototool. Photosensitive elements suitable for use as the precursor capable of forming the in-situ mask in digital workflow are described in U.S. Pat. No. 5,262,275; U.S. Pat. No. 5,719,009; U.S. Pat. No. 5,607,814; U.S. Pat. No. 6,238,837; U.S. Pat. No. 6,558,876; U.S. Pat. No. 6,929,898; U.S. Pat. No. 6,673,509; U.S. Pat. No. 5,607,814; U.S. Pat. No. 6,037,102; and U.S. Pat. No. 6,284,431. The precursor or an assemblage with the precursor includes a layer sensitive to infrared radiation and opaque to actinic radiation. The infrared-sensitive layer is imagewise exposed with laser radiation whereby the infrared-sensitive material is removed from, or transferred onto/from a superposed film of the assemblage, to form the in-situ mask having radiation opaque areas and clear areas adjacent the photopolymerizable layer. The precursor is overall exposed through the in-situ mask to actinic radiation in the presence of atmospheric oxygen, i.e., about 21% oxygen, (since no vacuum is needed). Furthermore, due in part to the presence of atmospheric oxygen during main exposure the flexographic printing form has a relief structure that is different from the relief structure formed in analog workflow (based upon the same size mask openings in both workflows). Digital workflow results in the relief image having a different structure of the raised surface areas. In particular, the fine raised surface of dots (i.e., the individual elements of a half-tone image) is typically smaller (than the actual mask opening), with a rounded top, and a curved sidewall profile, which is often referred to as dot sharpening effect. The printing form has improved resolution and dot gain since the in-situ mask is integral with the surface of the photopolymerizable layer and avoids actinic radiation spreading between the mask element and the surface of the precursor. The relief structure formed by digital workflow results in positive printing properties such as, finer printed highlight dots fading into white, increased range of printable tones, and sharp linework. The smaller fine raised surface of the dots also helps compensate for deformation of the elastomeric printing form during printing. As such, the digital workflow because of its ease of use and desirable print performance has gained wide acceptance as a desired method by which to produce the flexographic printing form.

However with ever-increasing demands on quality, the current state-of-the-art relief printing forms for flexographic printing may not perform as desired. It is desirable for flexographic printing forms to print solid areas with uniform, dense coverage of ink. Poor transfer or laydown of ink from the printing form to the substrate, especially in large areas, results in print defects, such as mottle and graininess. Flexographic printing forms having high durometer, that is printing forms having a Shore A greater than 65, oftentimes exhibit poor ink laydown. Unsatisfactory printing results are especially obtained with solvent-based printing inks, and with UV-curable printing inks.

There are a number of ways to try and improve the ink density in solid areas of an image printed by a flexographic printing form. One way to improve solid ink density is to increase the physical impression between the printing form and the substrate. While this will increase solid ink density, the increased pressure will tend to deform smaller plate elements resulting in increased dot gain and loss of resolution. This is especially apparent when printing on critical substrates like, for example, foils, where a lot of print defects can be observed. Similarly changes in the mounting tape used to hold the flexographic plate to the plate roll can also result in increased solid ink density by modifying the way the pressure is distributed across the plate surface. While the proper mounting tape can help mitigate some of the loss in dot gain with increasing pressure, it is still a compromise between the two competing attributes.

Another method of improving solid ink density involves increasing the surface area of the relief printing form. A relief printing form with a roughened surface can hold more ink than smooth surface. However, the surface roughness should be sufficient to increase ink transfer but not so much as to cause discreet features to directly print as this would result in undesirable artifacts in the final print. Bode et al. in WO 2003/079114 disclose a photosensitive element having a matted layer disposed above the photopolymerizable layer, and the matted layer includes a polymeric binder and a specific matting agent capable of anchored in the surface of the photopolymerizable layer. A printing form prepared from this photosensitive element by analog workflow successfully retains the roughened surface, but some instances there can be some loss of the fine structure of the roughened surface when prepared by conventional digital workflow. Rudolph et al. in U.S. Patent Publication 2004/0234886 disclose a photosensitive element having a matted layer disposed above the photopolymerizable layer, and the matted layer includes a polymeric binder and a specific matting agent capable of forming depressions into a plane of the photopolymerizable layer. In this photosensitive element the matted layer forms depressions that create a roughened surface at an interface between the photopolymerizable layer and the matted layer. A printing form prepared from this photosensitive element by analog workflow successfully retains the roughened surface, but some instances there can be some loss of the fine structure of the roughened surface when prepared by conventional digital workflow. Since in conventional digital workflow the exposure is done in the presence of atmospheric oxygen, a portion of the photopolymerizable layer at the interface may not cure. The features that do remain at the surface are relatively large compared with the smallest features in the digital workflow image. This results in missing or deformed features in the resulting printing form that result in print defects.

It is known to include small amount of particles into the photosensitive element to aid in analog workflow or as fillers. Chen et al. in U.S. Pat. No. 4,369,246 disclose the addition of immiscible polymeric or nonpolymeric organic or inorganic fillers, such as organophilic silicas and silicas, to a photosensitive layer in an elastomeric printing relief element. Cushner et al. in U.S. Pat. No. 5,798,202 and U.S. Pat. No. 5,804,353; Kannurpatti et al. in U.S. Pat. No. 6,737,216; and, Hiller et al. in U.S. Pat. No. 6,935,236 disclose processes for making a flexographic printing plate by laser engraving a reinforced elastomeric layer on a flexible support. The elastomeric layer can be reinforced mechanically by incorporating reinforcing agents, such as finely divided particulate material that includes silica and silicates into the elastomeric layer. Laser engraving is a method by which the relief structure of the printing form is created by laser radiation directly impinging the layer sufficient to remove polymeric material (by decomposition in the form of hot gases, vapors, fumes, or small particles) in depth from the relief layer. A mask is not used on the elastomeric layer for laser engraving since the laser can be controlled to selectively remove the polymeric material.

Another way to increase solid ink density printing capability for a relief printing form is through digital patterning of image areas of the precursor as disclosed by Stolt et al. in US Patent Publication 2010/0143841. Stolt et al. disclose applying a pattern to all image feature areas in halftone data that is used to produce an image mask, which is then used to convert the precursor into a relief printing form. After processing, the printing form carries a relief image that resolves the pattern in the surface of the relief features, and provides solid relief features to maintain or increase printed solid ink densities. The problem with this and similar approaches is that they generally require expensive upgrades to the (laser) devices that image the masks. In addition the process is more complicated in order to produce the effect. Samworth in U.S. Pat. No. 6,492,095 discloses a flexographic printing plate having solid image areas which are covered by a plurality of very small and shallow cells. The cells are created via a screened film halftone negative, an intermediate photomask, or via a top layer on the plate that is used as a mask. However, because the digital workflow is exposed in the presence of oxygen the smaller halftone images have to be relatively large. This can sometimes render them ineffective in certain printing applications or can result in visual artifacts.

So a need arises for relief printing form to meet the increasing demands for print quality to improve the transfer of ink to printed substrate and to print, particularly solid areas, with uniform, dense coverage of ink. There is a need for a method that is simple and relatively quick in preparing the relief printing form from a photosensitive printing form precursor, and can provide the printing form with a relief structure that improves transfer of ink to the substrate, without detrimental impact to dot gain and/or image resolution. It is also desirable for the printing form to have a relief structure capable of printing a full tonal range including printing of fine print elements and highlight dots and thereby providing improved print quality.

SUMMARY

In accordance with this invention there is provided a printing form precursor that comprises a photopolymerizable layer, an elastomeric layer, and an actinic radiation opaque material capable of forming an in-situ mask. The layer of a photopolymerizable composition is sensitive to actinic radiation, and comprises a binder, a monomer, and a photoinitiator. The layer of an elastomeric composition, that is or becomes sensitive to the actinic radiation, comprises at least an elastomeric binder, and particulate, the elastomeric composition having an index of refraction; wherein the particulate is selected from polyamide, polymethylmethacrylate, feldspar, nepheline syenite, or glass particles, the particulate having an average diameter from 1 to 10 micron and an index of refraction that is ±0.04 of the index of refraction of the elastomeric composition. The actinic radiation opaque material is on, adjacent, or disposed above the elastomeric layer b) opposite the photopolymerizable layer a), that is capable of forming the in-situ mask.

In accordance with another aspect of this invention there is provided a method to prepare a relief printing form comprising I) providing a printing form precursor as described above; II) forming an in-situ mask by imagewise exposing the actinic radiation opaque layer with laser radiation; III) overall exposing the precursor of step II) to actinic radiation through the in-situ mask, forming polymerized portions and unpolymerized portions in the photopolymerizable layer and the elastomeric layer; and IV) treating the precursor of III) to remove unpolymerized portions and form a relief surface suitable for printing.

In accordance with yet another aspect of the invention there is provided a process for forming a printing plate precursor comprising A) forming a multilayer cover element comprising applying a layer of an actinic radiation opaque material onto a temporary coversheet; and, applying a layer of an elastomeric composition on or adjacent the actinic radiation opaque layer, wherein the elastomeric composition is or become sensitive to actinic radiation and comprises at least an elastomeric binder and particulate; B) forming a layer of a photopolymerizable composition, that is sensitive to actinic radiation and comprises a binder, a monomer, and a photoinitiator, between a support and the multilayer cover element so that the elastomeric layer contacts the photopolymerizable layer; wherein the elastomeric composition has an index of refraction, and the particulate is selected from polyamide, polymethylmethacrylate, feldspar, nepheline syenite, or glass particles; and the particulate having an average diameter from 1 to 10 micron and an index of refraction that is ±0.04 of the index of refraction of the elastomeric composition.

DESCRIPTION OF THE PREFERRED EMBODIMENTS

The present invention concerns a printing form precursor and a method of preparing from the precursor a printing form suitable for use in relief printing, in particular flexographic printing. The printing form precursor is a photosensitive element, and in particular a photopolymerizable element, that includes: a layer of a photopolymerizable composition that includes at least a binder, a monomer, and a photoinitiator; a layer of an elastomeric composition that is or becomes sensitive to actinic radiation disposed on the photopolymerizable layer; and an actinic radiation opaque layer on, adjacent, or disposed above the elastomeric layer that is capable of forming in-situ mask. The printing form precursor may also be referred to herein as a photosensitive element, photopolymerizable element, photosensitive precursor, or photopolymerizable precursor. The elastomeric layer includes an elastomeric binder and particulate. The elastomeric composition, excluding the particulate, has an index of refraction. The particulate is selected from polyamide particles, polymethylmethacrylate particles, feldspar particles, nepheline syenite particles, or glass particles. The particles have an average diameter from 1 to 10 micron and an index of refraction that is ±0.04 of the index of refraction of the elastomeric composition.

The printing form precursor of the present invention has several advantages. The presence of the particulate in the elastomeric cap layer provides an improvement in print quality, and in particular, significant improvement in ink transfer from the printing form to the printed substrate, and thus solid ink density on the substrate. The improvement in printing quality is observed for several printing characterizations or attributes including, uniformity of ink transfer during the printing process, dot gain, and reproduction of fine text. An improvement in the uniformity of ink transfer is determined by an increase in the amount of ink transferred from the printing form to the substrate and/or an increase in the uniformity of laydown of the ink on the substrate, as determined by density in the areas of solid ink coverage, which may be referred to as solid ink density. When a printed dot is larger than the corresponding dot on the relief printing form, the growth of the printed dot is referred to as dot gain. It is desirable to minimize dot gain, since lower dot gain provides for improved tone reproduction in a printed image. The printing form resulting from the precursor has very good highlight dots (i.e., about 1 to 5% dots) that prints dots of the same or substantially the same size. And an improvement in the reproduction of quality of fine text is observed for both positive text and negative text, as well as in fine features forming highlight dots. Also, because of the small average diameter particle size, and very narrow particle size distribution, the presence of the particles in the elastomeric layer provide a roughened surface with minimal effect on the fine features of highlight dots of the relief. Further, the printing form resists wear of the relief surface and dot chipping of relief elements in the relief surface.

The printing form precursor, which is a photosensitive element or print precursor and particularly, a photopolymerizable element or print precursor, includes at least one layer of a photopolymerizable composition. As used herein, the term "photopolymerizable" is intended to encompass systems that are photopolymerizable, photocrosslinkable, or both. In cases where the composition layer comprises more than one photopolymerizable layer on the substrate, the composition of each of the photopolymerizable layers can be the same or different from any of the other photopolymerizable layers. The photopolymerizable layer is a solid elastomeric layer formed of the composition comprising a binder, a monomer, and a photoinitiator.

The photoinitiator has sensitivity to actinic radiation. Throughout this specification actinic radiation will include ultraviolet radiation and/or visible light. The solid layer of the photopolymerizable composition is treated with one or more solutions and/or heat to form a relief suitable for flexographic printing. As used herein, the term "solid" refers to the physical state of the layer that has a definite volume and shape and resists forces that tend to alter its volume or shape. The layer of the photopolymerizable composition is solid at room temperature, which is a temperature between about 5° C. and about 30° C. A solid layer of the photopolymerizable composition may be polymerized (photohardened), or unpolymerized, or both.

Unless otherwise indicated, the terms "printing form precursor", "photosensitive printing element", "flexographic printing plate or form", encompasses elements or structures in any form suitable for relief printing, particularly flexographic printing, including, but not limited to, flat sheets, plates, seamless continuous forms, cylindrical forms, plates-on-sleeves, and plates-on-carriers. As used herein, the term "printing form" means an object (e.g., in any form as indicated above) used to apply ink onto a surface for printing.

The photopolymerizable composition includes at least a binder, a monomer, and a photoinitiator. The binder for the photopolymerizable composition can be a single polymer or a mixture of two or more polymers. The binder is generally a preformed polymer that serves as a matrix for the monomer and photoinitiator prior to exposure and is a contributor to the physical properties of the photopolymer both before and after exposure. Binders include natural or synthetic polymers of conjugated diolefin hydrocarbons, including polyisoprene, 1,2-polybutadiene, 1,4-polybutadiene, and butadiene/acrylonitrile. In most embodiments, the binder is a thermoplastic binder which is an elastomeric block copolymer of an A-B-A type block copolymer, where A represents a non-elastomeric block, preferably a vinyl polymer and most preferably polystyrene, and B represents an elastomeric block, preferably polybutadiene or polyisoprene. Suitable thermoplastic elastomeric binders of this type include poly(styrene/isoprene/styrene) block copolymers and poly(styrene/butadiene/styrene) block copolymers which are preferred. The non-elastomer to elastomer ratio is preferably in the range of from 10:90 to 35:65. The binder can be a mixture of two or more thermoplastic elastomeric binders. An example of a photopolymerizable composition in which the binder is a combination of at least two different poly(styrene/isoprene/styrene) block copolymers is described by Dudek et al. in U.S. Pat. No. 5,972,565. In some embodiments, the binder is a combination of one or more poly(styrene/isoprene/styrene) block copolymers and one or more poly(styrene/butadiene/styrene) block copolymers. The binder is present from about 30 to about 85% by weight based on the total weight of the photopolymerizable composition. In some embodiments, the binder is present from about 45 to about 70% by weight of the photopolymerizable composition. In other embodiments the binder is present from about 60 to about 80% by weight of the photopolymerizable composition.

The term binder, as used herein, encompasses core shell microgels and blends of microgels and preformed macromolecular polymers, such as those disclosed U.S. Pat. No. 4,956,252 and U.S. Pat. No. 5,707,773.

Other suitable photosensitive elastomers that may be used include polyurethane elastomers. An example of a suitable polyurethane elastomer is the reaction product of (i) an organic diisocyanate, (ii) at least one chain extending agent having at least two free hydrogen groups capable of polymerizing with isocyanate groups and having at least one ethylenically unsaturated addition polymerizable group per molecule, and (iii) an organic polyol with a minimum molecular weight of 500 and at least two free hydrogen containing groups capable of polymerizing with isocyanate groups. For a more complete description of some of these materials see U.S. Pat. No. 5,015,556.

The photopolymerizable composition contains at least one compound capable of addition polymerization that is compatible with the binder to the extent that a clear, non-cloudy photosensitive layer is produced. The at least one compound capable of addition polymerization may also be referred to as a monomer and can be a single monomer or mixture of monomers. Monomers that can be used in the photopolymerizable composition are well known in the art and include, but are not limited to, addition-polymerization ethylenically unsaturated compounds with at least one terminal ethylenic group. Monomers can be appropriately selected by one skilled in the art to provide elastomeric property to the photopolymerizable composition. Generally the monomers have a molecular weight less than about 30,000. In most embodiments, the monomers have a relatively low molecular weight less than about 5000. The at least one monomer is not particularly limited, and in particular includes acrylate monoesters of alcohols and polyols; acrylate polyesters of alcohols and polyols; methacrylate monoesters of alcohols and polyols; methacrylate polyesters of alcohols and polyols; and combinations thereof. Alcohols and polyols include, for example, alkanols; alkylene glycols; trimethylol propane; ethoxylated trimethylol propane; pentaerythritol; dipentaerythritol; polyacrylol oligomers; and the like. If a polyacrylol oligomer is used, in some embodiments the oligomer has a molecular weight greater than 1000. A mixture of monofunctional and multifunctional acrylates or methacrylates may be used. Monomers suitable for use include, but are not limited to, hexanediol diacrylate; hexanediol dimethacrylate; ethylene glycol diacrylate; ethylene glycol dimethacrylate; diethylene glycol diacrylate; and trimethylol propane triacrylate. Acrylated oligomers and methacrylated oligomers are also suitable. Additionally, the monomer can include acrylate and methacrylate derivatives of isocyanates, esters, epoxides and the like. Also suitable for use as the monomer are oligomers of urethane-acrylates and polyester-acrylates. Also suitable for use are elastomeric monomers, examples of which include, but are not limited to, acrylated liquid polyisoprenes, acrylated liquid butadienes, liquid polyisoprenes with high vinyl content, and liquid polybutadienes with high vinyl content, (that is, content of 1-2 vinyl groups is greater than 20% by weight). Further examples of monomers can be found in U.S. Pat. No. 4,323,636; U.S. Pat. No. 4,753,865; U.S. Pat. No. 4,726,877; and U.S. Pat. No. 4,894,315. The compound capable of addition polymerization (monomer) is present from about 5 to 25% by weight based on the total weight of the photopolymerizable composition. In most embodiments, the monomer is present from about 5 to 15% by weight of the photopolymerizable composition. In other embodiments, the monomer is present from about 10 to 20% by weight of the photopolymerizable composition.

The photoinitiator can be any single compound or combination of compounds which is sensitive to actinic radiation, generating free radicals which initiate the polymerization of the monomer or monomers without excessive termination. Any of the known classes of photoinitiators, particularly free radical photoinitiators such as quinones, benzophenones, benzoin ethers, aryl ketones, peroxides, biimidazoles, benzyl dimethyl ketal, hydroxyl alkyl phenyl acetophone, dialkoxy actophenone, trimethylbenzoyl phosphine oxide derivatives, aminoketones, benzoyl cyclohexanol, methyl thio phenyl morpholino ketones, morpholino phenyl amino ketones, alpha halogennoacetophenones, oxysulfonyl ketones, sulfonyl ketones, oxysulfonyl ketones, sulfonyl ketones, benzoyl oxime esters, thioxanthrones, camphorquinones, ketocoumarins, Michler's ketone may be used. Alternatively, the photoinitiator may be a mixture of compounds, one of which provides the free radicals when caused to do so by a sensitizer activated by radiation. In most embodiments, the initiator is sensitive to visible or ultraviolet radiation. Photoinitiators are generally present in amounts from 0.001% to 10.0% based on the weight of the photopolymerizable composition.

Optionally, the photopolymerizable layer can contain spectral sensitizing agents. In general, spectral sensitizing agents are those materials that absorb radiation at a wavelength different than that of the reaction-initiating component, i.e., photoinitiator, and are capable of transferring the absorbed energy to the photoinitiator. Thus, the wavelength of the activating radiation can be adjusted.

The photopolymerizable layer can contain other additives depending on the final properties desired. Additional additives to the photopolymerizable layer include, but are not limited to, sensitizers, plasticizers, rheology modifiers, thermal polymerization inhibitors, colorants, processing aids, antioxidants, and antiozonants. Processing aids may be such things as low molecular weight polymers compatible with the elastomeric block copolymer, such as low molecular weight alpha-methylstyrene polymer or copolymer. Antiozonants include hydrocarbon waxes, norbornenes, and vegetable oils.

Suitable antioxidants include alkylated phenols, alkylated bisphenols, polymerized trimethyldihydroquinone, and dilauryl thiopropinoate.

Plasticizers are used to adjust the film forming properties of the elastomer. Examples of suitable plasticizers include aliphatic hydrocarbon oils, e.g., naphthenic and paraffinic oils; liquid polydienes, e.g., liquid polybutadiene; and liquid polyisoprene. Generally, plasticizers are liquids having molecular weights of less than about 5000, but can have molecular weights up to about 30,000. In some embodiments, the liquid plasticizers have molecular weights less than 3000, and in other embodiments less than 1500. Plasticizers having low molecular weight will encompass molecular weights less than about 30,000.

Flexographic printing plates formed from photopolymerizable compositions which are soluble, swellable, or dispersible in aqueous, semi-aqueous, or organic solvent developers (so called wet development) may also be suitable for thermal development to the extent that uncured photopolymerizable composition is also capable of liquefying upon heating to form a relief surface. Examples of suitable compositions for solvent development have been disclosed, for example, in U.S. Pat. No. 4,323,637; U.S. Pat. No. 4,427,749; and, U.S. Pat. No. 4,894,315.

The thickness of the photopolymerizable layer can vary over a wide range depending upon the end-use printing desired, for example, from about 0.010 inches to about 0.250 inches or greater (about 0.025 cm to about 0.64 cm or greater). For so-called "thin plates" typically the photopolymerizable layer can range from about 0.010 inches to about 0.067 inch (about 0.025 cm to about 0.17 cm) in thickness.

The layer of the photopolymerizable composition is an elastomeric layer that essentially provides the printing form with the bulk properties suitable for flexographic relief printing, but for the purposes herein it will be referred to as the photopolymerizable layer, photopolymerizable composition layer, or "bulk photopolymerizable layer".

The printing form precursor includes a layer of an elastomeric composition on the photopolymerizable layer. The elastomeric composition can be sensitive to or can become sensitive to the actinic radiation for the photopolymerizable composition. The elastomeric layer may also be referred to herein as an elastomeric capping layer or capping layer. The elastomeric capping layer should have an elastic modulus in the polymerized state not substantially less than the elastic modulus of the photopolymerizable layer in the exposed state. The elastomeric capping layer is similar to the photosensitive layer in that after imagewise exposure the unexposed portions of the elastomeric capping layer are removable by treating, and the exposed portions of the elastomeric capping layer remain on the underlying photopolymerized portions of the bulk photopolymerizable layer. Although it is contemplated that the particulate as described herein could be included with the photopolymerizable composition, it is believed that the improvement in ink transfer, and thus solid ink density, can be more effectively realized in relief printing forms in which the particulate is included in the elastomeric capping layer. The particulate can be more easily dispersed in the elastomeric capping layer which has a thickness that is substantially thinner than the bulk photopolymerizable layer, and thus more capable of positively influencing the exterior surface of the elastomeric layer that is the printing surface. And because of the relative thinness of the elastomeric capping layer, the amount particulate needed in the elastomeric composition would be less than that in the bulk photopolymerizable layer, to provide the same or substantially the same effective improvement in ink transfer.

The composition of the elastomeric layer includes at least an elastomeric polymeric binder and particulate. Optionally, the composition of the elastomeric cap layer can include one or more of the following, a secondary polymeric binder, one or more monomers, a non-migratory dye or pigment, and/or a photoinitiator or photoinitiation system. Elastomeric compositions that include one or more photosensitive components, such as monomer/s or photoinitiator, with the binder and particulate are representative of embodiments in which the elastomeric composition is sensitive to the actinic radiation used for the photopolymerizable composition. Elastomeric compositions that do not include photosensitive components, such as monomer/s or photoinitiator, with the binder and particulate are representative of embodiments in which the elastomeric composition becomes sensitive to the actinic radiation by contact with the underlying photopolymerizable layer, most typically when the precursor is formed.

Binders as described above that are suitable for the photopolymerizable composition are also suitable as the elastomeric binder for the elastomeric composition layer. In most embodiments, the elastomeric polymeric binder in the elastomeric composition is the same as or similar to the binder present in the photopolymerizable layer. In most embodiments, the elastomeric binder of the elastomeric composition includes natural or synthetic polymers of conjugated diolefin hydrocarbons, and thermoplastic binder which is an elastomeric block copolymer of an A-B-A type block copolymer, where A represents a non-elastomeric block, preferably a vinyl polymer and most preferably polystyrene, and B represents an elastomeric block, preferably polybutadiene or polyisoprene. Monomer/s, photoinitiators for the photopolymerizable composition as described above are also suitable as monomers and photoinitiators for the elastomeric layer. In most embodiments, the composition of the elastomeric capping layer (other than the particulate that is present) is a subset of the components in the photopolymerizable layer, i.e., the elastomeric capping layer and the photopolymerizable layer contain the same binder. In other embodiments, the composition of the elastomeric capping layer can be substantially the same as, or different from the composition of the adjacent photopolymerizable layer. The elastomeric capping layer is solid that generally forms a monolithic structure with the adjacent photopolymerizable layer. In some embodiments, the thickness of the elastomeric capping layer is from about 0.0005 inch to about 0.020 inch. In some other embodiments, the thickness of the elastomeric capping layer is from about 0.001 inch to about 0.010 inch (0.025 to 0.25 mm). In yet other embodiments, the thickness of the elastomeric capping layer is from about 0.001 inch to about 0.005 inch. In still other embodiments, the thickness of the elastomeric capping layer is from about 0.004 inch to about 0.015 inch.

The elastomeric composition contains the following parts by weight of the components:

| | |
|---|---|
| Elastomeric binder | 60 to 95 parts |
| Particulate | 5 to 40 parts |
| Secondary binder | 0 to 40 parts |
| Dye | 0 to 5 parts |
| Monomer/s (optional) | 0 to 20 parts |
| Photoinitiator (optional) | 0 to 10 parts |

In addition to the elastomeric polymer binder, the elastomeric capping layer includes particulate selected from polyamide particles, polymethylmethacrylate particles, feldspar particles, nepheline syenite particles, or glass particles. In some embodiments, the elastomeric capping layer includes the elastomeric binder and polyamide particles. In some other embodiments, the elastomeric capping layer includes the elastomeric binder and polymethylmethacrylate particles. In some other embodiments, the elastomeric capping layer includes the elastomeric binder and feldspar particles. In yet other embodiments, the elastomeric capping layer includes the elastomeric binder and nepheline syenite particles. In still other embodiments, the elastomeric capping layer includes the elastomeric binder and glass particles.

Feldspar is a general name for group of sodium aluminum silicates, potassium aluminum silicates, calcium aluminum silicates, and barium aluminum silicates.

Nepheline syenite is an anhydrous sodium potassium alumino silicate. In one embodiment, nepheline syenite is an anhydrous sodium potassium alumino silicate that does not contain free silica. Due to the absence of free silica, which is a carcinogen, nepheline syenite is particularly advantageous particulate. In some embodiments, particulates such as feldspar and nepheline syenite are prepared by grinding methods.

The type of glass particulate is not particularly limited, provided that refractive index and particle size limitations can be met. In most embodiments, the glass particulate is a soda lime glass that is composed of a mixture of sodium carbonate, lime, dolomite, silica, and aluminum oxide.

Polymethylmethacrylate (PMMA) is made by the addition polymerization of methylmethacrylate monomer. By controlling the polymerization process, it is possible to form discreet particles with tightly controlled dimensions through the use of techniques such as suspension or emulsion polymerization. Details about these techniques can be found in the Encyclopedia of Polymer Science and Engineering, $2^{nd}$ Edition (ISBN 0-471-80944-6, Vol. 12, p 511). It is also possible to add small amounts of a multifunctional co-monomer to produce crosslinked PMMA particles.

Polyamide is a polymer composed of multiple amide linkages. The amide links are produced from the condensation reaction of an amino group and a carboxylic acid or acid chloride group. Common materials of this class include nylons and aramids. The particle sizes of these materials can be controlled by the same methods mentioned above for PMMA. In some embodiments, the particulate prepared by polymerization reactions, such as the polyamide and the polymethylmethacrylate, advantageously provide the particulate with a narrow distribution of the diameter particle size about the average.

The particulate is dispersed in the elastomeric composition, and not merely applied to an exterior surface of the printing form precursor to form a layer of particles or powder. Particulate can be dispersed in the elastomeric composition by any means suitable for manufacture of the elastomeric layer and the precursor provided that conditions are conducive toward maintaining the size of the particles. In some embodiments, the elastomer is dissolved in solvent and the particulate is dispersed by either low or high shear mixing. In other embodiments, it is possible to disperse the particulate without solvent by melting the elastomer and mixing with compounders or extruders. It is important that these techniques be controlled so as to keep the particle size range within that described by this invention. For instance, too high shear mixing or too high of temperature experienced by the particulate can change the average diameter of the particulate.

The particulate is present in the elastomeric composition in an amount between and optionally including any two of the following values: 5, 10, 11, 12, 13, 14, 15, 18, 20, 21, 22, 23, 24, 25, 26, 27, 28, 29, 30, 32, 35, 37, and 40, as a percent by weight based on the total weight of the elastomeric composition. The particulate is present from about 10 to about 40% by weight based on the total weight of the elastomeric composition. In some embodiments, the particulate is present from about 20 to about 35% by weight of the elastomeric composition. In yet other embodiments, the particulate is present from about 15 to about 30% by weight of the elastomeric composition. In most embodiments, the elastomeric binder is in greater proportion than the particulate of the elastomeric composition. In some embodiments, the elastomeric binder is from about 60 to 80% by weight, and the particulate is from 40 to 20% by weight, of the elastomeric composition. In other embodiments, the elastomeric binder is from about 70 to about 95% by weight, and the particulate is from 30 to 5% by weight of the elastomeric composition. In yet other embodiments, the elastomeric binder is from about 65 to 85% by weight and the particulate is from 15 to 35% by weight of the elastomeric composition.

The particulate is composed of particles having an average diameter from 1 to 10 micron. The average diameter of the particulate is between and optionally including any two of the following values: 1, 2, 3, 4, 5, 6, 7, 8, 9, 10 micron. The particles need have an average diameter from 1 to 10 micron since printing forms made by digital workflow can have features below 30 microns, even as small as 15 microns. Particulate having particles with a diameter larger than 10 micron can cause light scattering during exposure, and/or cause fine elements of highlight dots to chip or break away. Since the particle is smaller than the smallest features of the relief obtained on the printing form, sufficient binder remains within the fine element to retain the particle in place. Particulate having particles with a diameter smaller than 1 micron, while possibly providing other or different benefit to a printing form precursor (e.g., reinforcement), is not expected to provide a significant improvement in ink transfer by the printing form. That is, it is not expected that a printing form having particulate with an average particle size less than 1 micron could increase solid ink uniformity and/or density on the printed substrate. One suitable method for determining particle size is by laser-based light scattering analysis, but other methods are also acceptable.

In most embodiments, the particulate has an average diameter of particles that is from 1 to 10 micron, and none or substantially none (i.e., less than 5%) of the particulate population has a diameter that is greater than 10 micron, and less than 5% of the particulate population has a diameter that is less than 1 micron. In other embodiments, the particulate has an average diameter of particles that is from 1 to 10 micron, and none or substantially none (i.e., less than 2%) of the particulate population has a diameter that is greater than 10 micron, and less than 2% of the particulate population has a diameter that is less than 1 micron. In yet other embodiments, the particulate has an average diameter of particles that is from 1 to 10 micron, and none or substantially none (i.e., less than 0.5%) of the particulate population has a diameter that is greater than 10 micron, and less than 2% of the particulate population has a diameter that is less than 1 micron. In some embodiments, the particulate has an average diameter particle size that is smaller than the finest raised feature that can be created on the relief surface of the print form, particularly by methods which use conventional digital workflow. The particulate has an average diameter of particles in some embodiments from 2 to 9 micron, in some embodiments from 4 to 6 micron; in some other embodiments from 5 to 8 micron; in other embodiments from 6 to 9 micron; and in other embodiments 2 to 8 micron.

In some embodiments, the particulate has a narrow size distribution of the particles such that at least 99.7% of the particles' diameter are within 3 standard deviation of the average particle size, within 1 to 10 micron.

In other embodiments, the particulate has been prepared or processed such that none or substantially none, that is 0.5 to less than 2%, of the particles have a diameter greater than 10 micron.

The particulate is composed of particles having an index of refraction that differs from the index of refraction of the elastomeric composition by less than 0.04 units. The index of refraction of the particulate is ±0.04 of the index of refraction of the elastomeric composition. In some embodiments, the index of refraction of the particulate is ±0.03 of the index of refraction of the elastomeric composition. In yet other embodiments, the index of refraction of the particulate is ±0.02 of the index of refraction of the elastomeric composition.

The printing form precursor having refractive index of the particulate within 0.04 units of the refractive index of the elastomeric composition avoids or minimizes internal reflections and additional light scattering during exposure. In some embodiments, it is expected that the index of refraction of the bulk photopolymerizable layer is within 0.04 units of the index of refraction of the elastomeric layer that is composed of at least the elastomeric binder and the particulate.

The index of refraction of the elastomeric composition is determined based upon all the components present, but without the presence of the particulate. Since in some embodiments, the elastomeric composition is coated as a solvent solution to form the layer in the multilayer cover element, the index of refraction would be measured without the solvent (and the particulate) present after the layer is formed. In most embodiments, the elastomeric composition is composed of the elastomeric binder and the particulate, and as such the refractive index of particulate is matched to within ±0.04 of the refractive index of the elastomeric binder. In some embodiments for A-B-A block copolymers as the elastomeric binder, the index of refraction is about 1.52 to about 1.54. In most embodiments in which the elastomeric composition includes only an elastomeric binder, the index of refraction of elastomeric A-B-A block copolymers is from 1.52 to 1.54, and the index of refraction of the particulate is from 1.48 to 1.58. In some embodiments in which the elastomeric composition includes only an elastomeric binder, the index of refraction of elastomeric A-B-A block copolymers is from 1.52 to 1.54, and the index of refraction of the particulate is from 1.49 to 1.57. In other embodiments, the refractive index of the particulate matches or substantially matches the refractive index of the elastomeric composition. In some other embodiments, the refractive index of the particulate matches or substantially matches the refractive index of the elastomeric binder that is the primary or only component in the elastomeric composition. In other embodiments in which the elastomeric composition includes one or more additional optional components, such as monomer or dye, with the binder and particulate, it is expected that the refractive index of the elastomeric composition may differ (from the refractive index of an elastomeric composition having only the elastomeric binder and particulate), but not significantly so since the elastomeric binder would be in greatest proportion of the elastomeric composition and therefore would have the most influence on the refractive index of the elastomeric composition.

The refractive index, or index of refraction, is an optical property of a material. The refractive index (RI) of a material is defined as the ratio of the speed of light in vacuum to that in the material. Refractive index of the elastomeric binder is measured with a refractometer. One suitable refractometer is a Metricon 2010 prism coupler (from Metricon Corp., Pennington, N.J.), measured at a wavelength of 633 nanometers. The refractive index of the particles used in this invention was provided by the manufacturers. A suitable method for determining the refractive index of a particle is exemplified by ASTM Test Method E1967-11a. In this method, the particles are dispersed in an oil whose refractive index is known at different temperatures. The oil is heated while the dispersion is watched under a phase contrast microscope. The temperature at which the minimal contrast is found is then recorded. This temperature is then used to determine the refractive index of the oil, which is equivalent to that of the particle.

The larger the difference in refractive index between the binder and the particulate, the more light scattering there will be. This can result in increasing shoulder angles for halftone dots, which results in further dot gain. An indication of this can be seen from the Fresnel equation shown below.

$$R = \frac{(n_1 - n_2)^2}{(n_1 + n_2)^2}$$

Where R is the % Reflectance, $n_1$ is the refractive index of the elastomeric composition and $n_2$ is the refractive index of the particulate. The higher the Reflectance the more light scattering that occurs.

Materials suitable for use as the particulate include, but are not limited to, the following.

| Trade Name | Company (Location) | Type | Average Particle Size (microns) | Refractive Index |
|---|---|---|---|---|
| Spheriglass A-6000 | Potters Industries, (Valley Forge, PA) | Soda Lime glass | 7 | 1.52 |
| Feldspar R500 | Pacer Corporation, (Custer, SD) | Feldspar | 8 | 1.53 |
| Minex 10 | Unimin, (New Canaan, CT) | Nepheline syenite | 5 | 1.55 |
| Orgasol 2001 UD NAT | Arkema Inc., (Philadelphia, PA) | Polyamide | 5 | 1.54 |
| SUN PMMA-S50 | Sunjin Chemical, (South Korea) | Polymethyl-methacrylate | 6 | 1.49 |

Common fillers that is not suitable as particulate in the present invention include silica, which has a refractive index of 1.46; and calcium carbonate which has refractive indexes of 1.65 and 1.48. Calcium carbonate has two refractive indexes due to its asymmetric crystalline structure.

Since the elastomeric capping layer is or becomes sensitive to actinic radiation, upon imagewise exposure to actinic radiation the elastomeric capping layer functions in much the same way as the underlying bulk photopolymerizable layer. After imagewise exposure, the elastomeric layer has exposed portions in which polymerization or crosslinking have occurred and unexposed portions which remain unpolymerized, i.e., uncross-linked. Treating of the printing form precursor removes the unpolymerized portions of the elastomeric capping layer along with the unpolymerized portions of the photopolymerizable layer, in order to form the relief surface. After treatment to remove the unpolymerized portions, the elastomeric capping layer that has been exposed to actinic radiation remains on the surface of the polymerized areas of the photopolymerizable layer and becomes the actual printing surface of the printing plate.

The printing form precursor includes an actinic radiation opaque layer on, adjacent, or disposed above the elastomeric layer b) opposite the photopolymerizable layer a). The actinic radiation opaque layer is capable of forming an in-situ mask on the elastomeric layer b). The actinic radiation opaque layer is substantially opaque to actinic radiation that corresponds with the sensitivity of the photopolymerizable and elastomeric layers. An in-situ mask includes clear areas and actinic radiation opaque areas that are integral or substantially integral with the printing form precursor. In most embodiments, the mask is formed by a digital method that uses laser radiation to form an image and graphic information of the in-situ mask. Materials constituting the actinic radiation opaque layer and structures incorporating the actinic radiation opaque layer are not particularly limited, provided that the radiation opaque layer can be imagewise exposed to form the in-situ mask on the photosensitive element.

In most embodiments, the actinic radiation opaque layer also is sensitive to infrared laser radiation, and thus may be identified as an infrared-sensitive layer. The actinic radiation opaque layer can be on or adjacent the elastomeric capping layer, or on a temporary support which together with the photosensitive precursor form an assemblage. Actinic radiation opaque layers and infrared-sensitive layers are well known in the art for digital workflow. The actinic radiation opaque layer can be ablated (i.e., vaporized or removed) from the elastomeric layer on the side opposite the photopolymerizable composition by imagewise exposure to infrared laser radiation. Alternatively, when the printing form precursor forms an assemblage with a temporary support carrying the infrared-sensitive layer, the actinic radiation opaque layer can be transferred from the temporary support to the external surface (the side opposite the flexible substrate) of the elastomeric layer by imagewise exposure to infrared laser radiation. The infrared-sensitive layer can be used alone or with other layers, e.g., ejection layer, heating layer, etc.

The actinic radiation opaque layer generally comprises an infrared-absorbing material, a radiation-opaque material, and an optional binder. Dark inorganic pigments, such as carbon black and graphite, generally function as both infrared-sensitive material and radiation-opaque material. Materials suitable as the optional binder for a composition forming the actinic radiation opaque layer can include, but are not limited to, polyamides, polyethylene oxide, polypropylene oxide, ethylcellulose, hydroxyethyl cellulose, cellulose acetate butyrate, ethylene-propylene-diene terpolymers, copolymers of ethylene and vinyl acetate, copolymers of vinyl acetate and vinyl alcohol, copolymers of vinyl acetate and pyrrolidone, polyvinyl acetate, polyethylene wax, polyacetal, polybutyral, polyalkylene, polycarbonates, cyclic rubber, copolymer of styrene and maleic anhydride, copolymer of styrene and maleic anhydride partially esterified with alcohol, polyester elastomers, and combinations thereof.

The thickness of the actinic radiation opaque layer should be in a range to optimize both sensitivity and opacity to actinic radiation (e.g., has an optical density of $\geq 2.5$). Such infrared-sensitive photoablative or phototransferable layer can be employed in digital direct-to-plate image technology in which the exposure by laser radiation removes or transfers the infrared-sensitive layer to form an in-situ mask on the photosensitive element. Suitable infrared-sensitive compositions, elements, and their preparation are disclosed in U.S. Pat. No. 5,262,275; U.S. Pat. No. 5,719,009; U.S. Pat. No. 5,607,814; U.S. Pat. No. 5,506,086; U.S. Pat. No. 5,766,819; U.S. Pat. No. 5,840,463; U.S. Pat. No. 5,925,500; U.S. Pat. No. 6,606,410; U.S. Pat. No. 6,238,837; U.S. Pat. No. 6,558,876; and U.S. Pat. No. 6,773,859. The in-situ mask of actinic radiation opaque material is removable during treating.

In most embodiments, the actinic radiation opaque layer is integral with the precursor and substantially covers the exterior surface of the precursor, i.e., a surface of the elastomeric layer opposite side in contact with the photopolymerizable layer. After imagewise exposure by laser radiation, which ablates or vaporizes the actinic radiation opaque material from the precursor, only the portions of the radiation opaque layer that were not removed from the precursor will remain on the precursor forming the in-situ mask. In other embodiments, the precursor will not initially include the actinic radiation opaque layer, and a separate element bearing the radiation opaque layer will form an assemblage with the precursor such that the radiation opaque layer is adjacent the exterior surface of the precursor. The assemblage is exposed imagewise with infrared laser radiation to selectively transfer or selectively alter the adhesion balance of the actinic radiation opaque layer and form the image on or disposed above the elastomeric layer. The separate element may be peeled or lifted away from the photosensitive element to reveal the in-situ mask. Materials and structures suitable for this actinic radiation opaque layer are disclosed by Fan et al. in U.S. Pat. No. 5,607,814; and Blanchett in U.S. Pat. Nos. 5,766,819; 5,840,463; and EP 0 891 877A. As a result of the imagewise transfer process, only the transferred portions of the radiation opaque layer will reside on the precursor forming the in-situ mask.

In yet other embodiments, it is also contemplated that digital mask formation can be accomplished by imagewise application of the radiation opaque material in the form of inkjet inks. Imagewise application of an ink-jet ink can be directly on or disposed above the elastomeric layer. While inkjet inks do not form a layer, inkjet inks can be an actinic radiation opaque material that is capable of forming an in-situ mask.

The photosensitive element of the present invention may further include a temporary coversheet on top of the uppermost layer of the photosensitive element. One purpose of the coversheet is to protect the uppermost layer of the photosensitive element during storage and handling. Depending upon end use, the coversheet may or may not be removed prior to imaging, but is removed prior to development. Suitable materials for the coversheet are well known in the art.

The support can be any flexible material that is conventionally used with photosensitive elements used to prepare flexographic printing plates. Preferably the support is transparent to actinic radiation to accommodate "backflash" exposure through the support. Examples of suitable support materials include polymeric films such those formed by addition polymers and linear condensation polymers, transparent foams and fabrics. Under certain end-use conditions, metals such as aluminum may also be used as a support, even though a metal support is not transparent to radiation. A preferred support is a polyester film; particularly preferred is polyethylene terephthalate. The support may be in sheet form or in cylindrical form, such as a sleeve. The sleeve may be formed from single layer or multiple layers of flexible material. Flexible sleeves made of polymeric films are preferred, as they typically are transparent to ultraviolet radiation and thereby accommodate backflash exposure for building a floor in the cylindrical printing element. Multiple layered sleeves may include an adhesive layer or tape between the layers of flexible material. An example of a suitable multiple layered sleeve is disclosed in U.S. Pat. No. 5,301,610. The sleeve may also be made of non-transparent, actinic radiation blocking materials, such as nickel or fiber-reinforced epoxy. In most embodiments, the support has a thickness from 0.002 to 0.080 inch (0.0051 to 0.203 cm) or more. In most embodiments, the thickness for the sheet form is 0.003 to 0.016 inch (0.0076 to 0.040 cm). The sleeve typically has a wall thickness from 0.008 to 0.080 inch (0.02 to 0.203 cm) or more. In most embodiments, the wall thickness for the sleeve is 10 to 40 mils (0.025 to 0.10 cm). In some embodiments, the wall thickness for the sleeve is 0.005 to 0.035 inch (0.125 to 0.875 mm). The wall thickness of the sleeve may be adjusted to accommodate different diameter sleeves.

Optionally, the element includes an adhesive layer between the support and the photopolymerizable layer, or a surface of the support that is adjacent the photopolymerizable layer has an adhesion promoting surface. The adhesive layer on the surface of the support can be a subbing layer of an adhesive material or primer or an anchor layer as disclosed in U.S. Pat. No. 2,760,863 to give strong adherence between the support and the photopolymerizable layer. The adhesive compositions disclosed in U.S. Pat. No. 3,036,913 are also effective. Alternatively, the surface of the support on which the photopolymerizable layer resides can be treated to promote adhesion between the support and the photopolymerizable layer, with flame-treatment or electron-treatment, e.g., corona-treated. Further, the adhesion of the photopolymerizable layer to the support can be adjusted by exposing the element to actinic radiation through the support as disclosed by Feinberg et al. in U.S. Pat. No. 5,292,617.

In most embodiments, the photosensitive printing precursor includes a support, a layer of a photopolymerizable composition on the support, a layer of the elastomeric composition on the photopolymerizable layer opposite the support, and a layer of actinic radiation opaque material capable of forming an in-situ mask on or adjacent the elastomeric layer opposite the photopolymerizable layer, wherein the elastomeric layer includes at least an elastomeric binder and particulate selected from polyamide, polymethylmethacrylate, feldspar, nepheline syenite, or glass particles having an average diameter from 1 to 10 micron and index of refraction that is within 0.04 of the index of refraction of the elastomeric composition (without the particulate).

In other embodiments, the photosensitive printing precursor includes a layer of the photopolymerizable composition, a layer of the elastomeric composition on the photopolymerizable layer, and a layer of actinic radiation opaque material capable of forming an in-situ mask on the elastomeric layer opposite the photopolymerizable layer, wherein the elastomeric layer includes at least an elastomeric binder and particulate selected from polyamide, polymethylmethacrylate, feldspar, nepheline syenite, or glass particles having an average diameter from 1 to 10 micron and index of refraction that is within 0.04 of the index of refraction of the elastomeric composition (without the particulate).

In other embodiments, the photosensitive printing precursor includes a support, a layer of the photopolymerizable composition on the support, a layer of the elastomeric composition on the photopolymerizable layer opposite the support, and an in-situ mask of an actinic radiation opaque material on or adjacent the elastomeric layer opposite the photopolymerizable layer, wherein the elastomeric layer includes at least an elastomeric binder and particulate selected from polyamide, polymethylmethacrylate, feldspar, nepheline syenite, or glass particles having an average diameter from 1 to 10 micron and index of refraction that is within 0.04 of the index of refraction of the elastomeric composition (without the particulate).

In other embodiments, the photosensitive printing precursor includes a layer of the photopolymerizable composition that includes an A-B-A elastomeric block copolymer, at least one monomer, and a photoinitiator; a layer of the elastomeric composition on the photopolymerizable layer that includes an A-B-A elastomeric block copolymer that can be the same or different from the block copolymer in the photopolymerizable composition, and particulate; and a layer of actinic radiation opaque material capable of forming an in-situ mask on the elastomeric layer opposite the photopolymerizable layer, wherein the particulate is selected from polyamide, polymethylmethacrylate, feldspar, nepheline syenite, or glass particles having an average diameter from 1 to 10 micron and index of refraction that is within 0.04 of the index of refraction of the elastomeric composition (without the particulate).

In yet other embodiments, the photosensitive printing precursor includes a layer of the photopolymerizable composition, a layer of the elastomeric composition on the photopolymerizable layer, and a layer of actinic radiation opaque material capable of forming an in-situ mask on the elastomeric layer opposite the photopolymerizable layer, wherein the elastomeric layer includes at least an elastomeric binder and particulate selected from polyamide or polymethylmethacrylate particles having an average diameter from 1 to 10 micron and index of refraction that is within 0.04 of the index of refraction of the elastomeric composition (without the particulate).

In yet other embodiments, the photosensitive printing precursor includes a layer of the photopolymerizable composition, a layer of the elastomeric composition on the photopolymerizable layer, and a layer of actinic radiation opaque material capable of forming an in-situ mask on the elastomeric layer opposite the photopolymerizable layer, wherein the elastomeric layer includes at least an elastomeric binder and particulate selected from feldspar, nepheline syenite, or glass particles having an average diameter from 1 to 10 micron and index of refraction that is within 0.04 of the index of refraction of the elastomeric composition (without the particulate).

In yet other embodiments, the photosensitive printing precursor includes a layer of the photopolymerizable composition, a layer of the elastomeric composition on the photopolymerizable layer, and a layer of actinic radiation opaque material capable of forming an in-situ mask on the elastomeric layer opposite the photopolymerizable layer, wherein the elastomeric layer includes at least an elastomeric binder and polyamide particulate having an average diameter from 1 to 10 micron and index of refraction that is within 0.04 of the index of refraction of the elastomeric composition (without the particulate).

In yet other embodiments, the photosensitive printing precursor includes a layer of the photopolymerizable composition, a layer of the elastomeric composition on the photopolymerizable layer, and a layer of actinic radiation opaque material capable of forming an in-situ mask on the elastomeric layer opposite the photopolymerizable layer, wherein the elastomeric layer includes at least an elastomeric binder and polymethylmethacrylate particulate having an average diameter from 1 to 10 micron and index of refraction that is within 0.04 of the index of refraction of the elastomeric composition (without the particulate).

In yet other embodiments, the photosensitive printing precursor includes a layer of the photopolymerizable composition, a layer of the elastomeric composition on the photopolymerizable layer, and a layer of actinic radiation opaque material capable of forming an in-situ mask on the elastomeric layer opposite the photopolymerizable layer, wherein the elastomeric layer includes at least an elastomeric binder and feldspar particulate having an average diameter from 1 to 10 micron and index of refraction that is within 0.04 of the index of refraction of the elastomeric composition (without the particulate).

In yet other embodiments, the photosensitive printing precursor includes a layer of the photopolymerizable composition, a layer of the elastomeric composition on the photopolymerizable layer, and a layer of actinic radiation opaque material capable of forming an in-situ mask on the elastomeric layer opposite the photopolymerizable layer, wherein the elastomeric layer includes at least an elastomeric binder and nepheline syenite particulate having an average diameter from 1 to 10 micron and index of refraction that is within 0.04 of the index of refraction of the elastomeric composition (without the particulate).

In yet other embodiments, the photosensitive printing precursor includes a layer of the photopolymerizable composition, a layer of the elastomeric composition on the photopolymerizable layer, and a layer of actinic radiation opaque material capable of forming an in-situ mask on the elastomeric layer opposite the photopolymerizable layer, wherein the elastomeric layer includes at least an elastomeric binder and soda lime glass particulate having an average diameter from 1 to 10 micron and index of refraction that is within 0.04 of the index of refraction of the elastomeric composition (without the particulate).

The photosensitive printing form precursor can be prepared by employing a variety of techniques that are well known in the art. The photopolymerizable layer itself can be prepared in many ways by admixing the binder, monomer, initiator, and other ingredients. In most embodiments, the photopolymerizable composition is formed into a hot melt and then calendered to the desired thickness. An extruder can be used to perform the functions of melting, mixing, deaerating and filtering the composition. To achieve uniform thickness, the extrusion step can be coupled with a calendering step in which the hot mixture is calendered between the support and a temporary coversheet. The temporary coversheet may include one or more additional layers that transfer to the photopolymerizable layer when the precursor is formed. In some embodiments, the temporary coversheet includes at least the elastomeric layer. In most embodiments, the temporary coversheet is a multilayer coversheet that includes the elastomeric layer and the actinic radiation opaque layer. Alternately, the material can be extruded and calendered onto a temporary support and later laminated to the desired final support. Alternatively, the photopolymerizable material can be placed between the support and the temporary coversheet in a mold. The layers of material are then pressed flat or into desired shape by the application of heat and/or pressure. Cylindrical seamless photopolymerizable elements may be prepared according to the method and apparatus disclosed by Cushner et al. in U.S. Pat. No. 5,798,019.

In most embodiments, the elastomeric capping layer is typically made separately as part of a multilayer cover element, which becomes part of the photosensitive printing precursor during calendering of the photopolymerizable layer. Such multilayer cover elements, their manufacture, and compositions suitable as the elastomeric capping layer are disclosed in Gruetzmacher et al., U.S. Pat. No. 4,427,759 and U.S. Pat. No. 4,460,675. Although the elastomeric capping layer may not necessarily contain photoreactive components when formed, the layer ultimately becomes photosensitive when in contact with the photopolymerizable layer. In most embodiments contact between the elastomeric cap layer and the bulk photopolymerizable layer occurs when the printing form precursor is manufactured by calendering the photopolymerizable composition between the multilayer cover element and a support. One of ordinary skill in the art can contemplate other methods of making the printing form precursor with the elastomeric capping layer.

A layer of actinic radiation opaque material suitable for forming the in-situ mask can be included in the multilayer cover element having the elastomeric layer to form the precursor during calendering of the photopolymerizable layer. Other methods of including an actinic radiation opaque layer (that is capable of forming the in-situ mask) on the precursor are possible as disclosed in U.S. Pat. No. 5,262,275; U.S. Pat. No. 5,719,009; U.S. Pat. No. 5,607,814; U.S. Pat. No. 5,506,086; U.S. Pat. No. 5,766,819; U.S. Pat. No. 5,840,463; U.S. Pat. No. 5,925,500; U.S. Pat. No. 6,606,410; U.S. Pat. No. 6,238,837; U.S. Pat. No. 6,558,876; and U.S. Pat. No. 6,773,859.

For direct-to-plate image formation as disclosed in U.S. Pat. No. 5,262,275; U.S. Pat. No. 5,719,009; U.S. Pat. No. 5,607,814; U.S. Pat. No. 5,506,086; U.S. Pat. No. 5,766,819; U.S. Pat. No. 5,840,463; U.S. Pat. No. 6,238,837; U.S. Pat. No. 6,558,876; and U.S. Pat. No. 6,773,859 the image-bearing mask is formed in-situ with the laser radiation sensitive layer using an infrared laser exposure engine. The imagewise laser exposure can be carried out using various types of infrared lasers, which emit in the range 750 to 20,000 nm, preferably in the range 780 to 2,000 nm. Diode lasers may be used, but Nd:YAG lasers emitting at 1060 nm are preferred.

The photosensitive printing form precursor having the in-situ mask is imagewise exposed to actinic radiation. After imagewise exposure, the photosensitive precursor contains cured portions in the exposed areas of the photopolymerizable composition layer and the elastomeric layer; and, uncured portions in the unexposed areas of the photopolymerizable composition layer and the elastomeric layer. Imagewise exposure is carried out by exposing the precursor to actinic radiation, i.e., ultraviolet radiation, through an image-bearing mask. The image-bearing mask is an in-situ mask on or adjacent the elastomeric layer that is formed by laser radiation of the actinic radiation opaque material. In most embodiments, imagewise exposure to actinic radiation is a conventional digital workflow in which exposure is conducted in the presence of atmospheric oxygen, that is, at a concentration of oxygen of about 21%.

In other embodiments, imagewise exposure to actinic radiation is a modified digital workflow in which exposure is conducted in an environment having an inert gas and a concentration of oxygen less than the atmospheric concentration of oxygen. In some embodiments, the environment has an oxygen concentration of 190,000 to 100 part per million (ppm). In some embodiments, the environment has an oxygen concentration of 190,000 to 10,000 part per million (ppm). In some other embodiments, the environment has an oxygen concentration of 190,000 to 50,000 part per million (ppm). In some other embodiments, the environment has an oxygen concentration of 190,000 to 80,000 part per million (ppm). The inert gas is a gas that exhibits no or a low reaction rate with the photosensitive element (that is, inert to the polymerization reaction), and is capable of displacing oxygen in the exposure environment. Suitable inert gases include, but are not limited to, argon, helium, neon, krypton, xenon, nitrogen, carbon dioxide, and combinations thereof. In one embodiment, the inert gas is nitrogen. On exposure, the transparent or clear areas of the mask allow addition polymerization or crosslinking to take place, while the actinic radiation opaque areas remain uncrosslinked. Exposure is of sufficient duration to crosslink the exposed areas down to the support or to a back exposed layer (floor). Imagewise exposure time is typically much longer than backflash time, and ranges from a few to tens of minutes.

Actinic radiation sources encompass the ultraviolet and visible wavelength regions. The suitability of a particular actinic radiation source is governed by the photosensitivity of the initiator and the at least one monomer used in preparing the printing forms from the photosensitive precursor. The preferred photosensitivity of most common photosensitive printing form precursor is in the UV and deep visible area of the spectrum, as they afford better room-light stability. The portions of the composition layer that are exposed to radiation chemically crosslink and cure. The portions of the composition layer that are unirradiated (unexposed) are not cured, and can be removed by treating with solvent or aqueous washout solutions, or with heat as the uncured portions have a lower melting or liquefying temperature than the cured irradiated portions. The imagewise exposed photosensitive element is then ready for treatment to remove unpolymerized areas in the photopolymerizable layer and the elastomeric layer; and thereby form a relief image areas of the image.

An overall back exposure through the support side, a so-called backflash exposure, may be conducted to polymerize a predetermined thickness of the photopolymer layer adjacent the support. The backflash exposure may be conducted before, after, or even during other imaging steps, the imagewise exposure. This polymerized portion of the photopolymer layer is designated a floor. The floor provides improved adhesion between the photopolymerizable layer and the support, helps highlight dot resolution and also establishes the depth of the plate relief. The floor thickness varies with the time of exposure, exposure source, etc. This exposure may be done diffuse or directed. All radiation sources suitable for imagewise exposure may be used. The exposure is generally for 10 seconds to 30 minutes.

Following overall exposure to actinic radiation, i.e., UV radiation through the mask, the photosensitive printing precursor is treated to remove the unpolymerized areas in the photopolymerizable layer and the elastomeric layer, and thereby form a relief image. The treating step removes at least the photopolymerizable layer and the elastomeric layer in the areas which were not exposed to actinic radiation, i.e., the unexposed areas or uncured areas, of the photopolymerizable layer. For photosensitive precursors having the in-situ mask that was formed digitally, the treating step also removes the mask image (which had been exposed to actinic radiation) and the underlying unexposed areas of the photopolymerizable layer and the elastomeric layer.

Treatment of the photosensitive printing precursor includes (1) "wet" development wherein the photopolymerizable layer and the elastomeric layer are contacted with a suitable developer solution to washout unpolymerized areas and (2) "dry" development wherein the precursor is heated to a development temperature which causes the unpolymerized areas of the photopolymerizable layer and elastomeric layer to melt or soften or flow and then are removed. Dry development may also be called thermal development. It is also contemplated that combinations of wet and dry treatment can be used to form the relief.

Wet development is usually carried out at about room temperature. The developers can be organic solvents, aqueous or semi-aqueous solutions, and water. The choice of the developer will depend primarily on the chemical nature of the photopolymerizable material to be removed. Suitable organic solvent developers include aromatic or aliphatic hydrocarbon and aliphatic or aromatic halohydrocarbon solvents, or mixtures of such solvents with suitable alcohols. Other organic solvent developers have been disclosed in published German Application 38 28 551. Suitable semi-aqueous developers usually contain water and a water miscible organic solvent and an alkaline material. Suitable aqueous developers usually contain water and an alkaline material. Other suitable aqueous developer combinations are described in U.S. Pat. No. 3,796,602.

Development time can vary, but it is preferably in the range of about 2 to about 25 minutes. Developer can be applied in any convenient manner, including immersion, spraying and brush or roller application. Brushing aids can be used to remove the unpolymerized portions of the element. Washout can be carried out in an automatic processing unit which uses developer and mechanical brushing action to remove the uncured portions of the plate, leaving a relief constituting the exposed image and the floor.

Following treatment by developing in solution, the relief printing plates are generally blotted or wiped dry, and then more fully dried in a forced air or infrared oven. Drying times and temperatures may vary, however, typically the plate is dried for 60 to 120 minutes at 60° C. High temperatures are not recommended because the support can shrink and this can cause registration problems.

Treating the precursor thermally includes heating the photosensitive precursor having at least one photopolymerizable layer and the elastomeric to a temperature sufficient to cause the uncured portions of the layers to liquefy, i.e., soften or melt or flow, and removing the uncured portions. The photosensitive composition layer and the elastomeric layer are capable of partially liquefying upon thermal development. That is, during thermal development the uncured composition must soften or melt at a reasonable processing or developing temperature. If the photosensitive precursor includes one or more additional layers, it is preferred that the one or more additional layers are also removable in the range of acceptable developing temperatures for the photopolymerizable and elastomeric layers. The polymerized areas (cured portions) of the photopolymerizable layer and elastomeric layer have a higher melting temperature than the unpolymerized areas (uncured portions) and therefore do not melt, soften, or flow at the thermal development temperatures. The uncured portions can be removed from the cured portions of the photopolymerizable composition and elastomeric layers by any means including air or liquid stream under pressure as described in U.S. publication 2004/0048199 A1, vacuum as described in Japanese publication 53-008655, and contacting with an absorbent material as described in U.S. Pat. No. 3,060,023; U.S. Pat. No. 3,264,103; U.S. Pat. No. 5,015,556; U.S. Pat. No. 5,175,072; U.S. Pat. No. 5,215,859; U.S. Pat. No. 5,279,697; and U.S. Pat. No. 6,797,454. In most embodiments the thermal treating method for removing the uncured portions is by contacting an outermost surface of the precursor to an absorbent surface, such as a development medium, to absorb or wick away or blot the melt portions.

The term "melt" is used to describe the behavior of the unirradiated (uncured) portions of the composition layer (and elastomeric layer) subjected to an elevated temperature that softens and reduces the viscosity to permit absorption by the absorbent material. The material of the meltable portion of the composition layer is usually a viscoelastic material which does not have a sharp transition between a solid and a liquid, so the process functions to absorb the heated composition layer at any temperature above some threshold for absorption in the development medium. Thus, the unirradiated portions of the composition layer soften or liquefy when subjected to an elevated temperature. However throughout this specification the terms "melting", "softening", and "liquefying" may be used to describe the behavior of the heated un-irradiated portions of the composition layer, regardless of whether the composition may or may not have a sharp transition temperature between a solid and a liquid state. A wide temperature range may be utilized to "melt" the composition layer for the purposes of this invention. Absorption may be slower at lower temperatures and faster at higher temperatures during successful operation of the process.

The thermal treating steps of heating the printing form precursor and contacting an outermost surface of the precursor with development medium can be done at the same time, or in sequence provided that the uncured portions of the photopolymerizable layer and the elastomeric layer are still soft or in a melt state when contacted with the development medium. The at least one photopolymerizable layer (and the elastomeric layer) are heated by conduction, convection, radiation, or other heating methods to a temperature sufficient to effect melting of the uncured portions but not so high as to effect distortion of the cured portions of the layer. The one or more additional layers disposed above the photopolymerizable layer and elastomeric layer may soften or melt or flow and be absorbed as well by the development medium. The precursor is heated to a surface temperature above about 40° C., preferably from about 40° C. to about 230° C. (104-446° F.) in order to effect melting or flowing of the uncured portions of the photopolymerizable layer. By maintaining more or less intimate contact of the development medium with the exterior surface of the precursor, i.e., elastomeric layer and photopolymerizable layer that is molten in the uncured regions, a transfer of the uncured material from the photopolymerizable layer and the elastomeric layer to the development medium takes place. While still in the heated condition, the development medium is separated from the cured elastomeric layer and photopolymerizable layer in contact with the support layer to reveal the relief structure. A cycle of the steps of heating the photopolymerizable and elastomeric layers and contacting the molten (portions) layer with the development medium can be repeated as many times as necessary to adequately remove the uncured material and create sufficient relief depth. However, it is desirable to minimize the number of cycles for suitable system performance, and typically the precursor is thermally treated for 5 to 15 cycles. Intimate contact of the development medium to the photopolymerizable layer (while in the uncured portions are melt) may be maintained by the pressing the layer and the development medium together.

Apparatuses suitable for thermally developing the printing form precursor are disclosed by Peterson et al. in U.S. Pat. No. 5,279,697, and also by Johnson et al. in U.S. Pat. No. 6,797,454. The precursor in all embodiments is in the form of a plate. However, it should be understood that one of ordinary skill in the art could modify each of the disclosed apparatuses to accommodate the mounting of the precursor in the form of a cylinder or a sleeve.

The development medium is selected to have a melt temperature exceeding the melt or softening or liquefying temperature of the un-irradiated or uncured portions of the radiation curable composition and having good tear resistance at the same operating temperatures. Preferably, the selected material withstands temperatures required to process the photosensitive element during heating. The development medium may also be referred to herein as development material, absorbent material, absorbent web, and web. The development medium is selected from non-woven materials, paper stocks, fibrous woven material, open-celled foam materials, porous materials that contain more or less a substantial fraction of their included volume as void volume. The development medium can be in web or sheet form. The development medium should also possess a high absorbency for the molten elastomeric composition as measured by milligrams of elastomeric composition that can be absorbed per square centimeter of the development medium. It is also desirable that fibers are bonded in development mediums containing fibers so that the fibers are not deposited into the form during development. Non-woven nylon and polyester webs are preferred.

After the treatment step, the precursor can be uniformly post-exposed to ensure that the photopolymerization process is complete and that the so formed relief printing form will remain stable during printing and storage. This post-exposure step can utilize the same radiation source as the imagewise main exposure. Furthermore, if the surface of the relief printing form is still tacky, detackification treatments may be applied. Such methods, which are also called "finishing", are well known in the art. For example, tackiness can be eliminated by a treatment of the printing form with bromine or chlorine solutions. Preferably, detackification is accomplished by exposure to UV radiation sources having a wavelength not longer than 300 nm. This so-called "light-finishing" is disclosed in European Published Patent Application 0 017927 and U.S. Pat. No. 4,806,506. Various finishing methods may also be combined. Typically, the post-exposure and the finishing exposure are done at the same time on the precursor using an exposure device that has both sources of radiation.

Printing forms (i.e., photosensitive printing form precursor that has been exposed and treated) prepared according to the present method can have a durometer of about 40 to 70 Shore A. Durometer is one of several ways to indicate the hardness of a material, and is defined as the resistance of a material to permanent indentation. Durometer measures the depth of an indentation in a material (typically specified as having a 0.25 inch thickness) by a given force on a standardized presser foot. There are several scales of durometer, of which the Shore A scale is typically used for softer plastics. Each scale results in a value between 0 and 100, with higher values indicating a harder material. Shore A durometer is also typically used to characterize elastomeric printing precursors and printing forms. However, in some instances printing forms are not available at the specified thickness of 0.25 inch (0.64 cm) used for Shore A durometer measurements. So the measurement of the Shore A durometer is often conducted on readily available printing forms having on 67 mil (0.067 inch) (0.17 cm) thickness (that is, the thickness of the photopolymerizable layer and the support). In some embodiments, the printing form (having a total thickness of the photopolymerizable layer, elastomeric layer, and the support of 67 mil) has a durometer of about 50 to 80 Shore A. In some embodiments, the durometer of the printing form having a thickness of 67 mil is from 50 to 65 Shore A. In other embodiments, the durometer of the printing form 65 to 80 Shore A. The Shore A durometer can be measured, for example, using a Shore Durometer Hardness Gauge Type "A-2" manufactured by The Shore Instrument & Manufacturing Company, Inc. (Jamaica, N.Y., USA). Other instruments for measuring Shore A durometer are readily available and are well known to those of ordinary skill in the art.

Although the present method is directed to a printing form precursor as described above and a method for preparing a printing form from the precursor using digital workflow, it is contemplated that the precursor could be used for preparing a printing form by other alternate conventional flexographic platemaking steps method steps, such as, analog workflow that uses a phototool instead of digital workflow using an in-situ mask, and/or by photochemical reinforcement and laser engraving to form the relief pattern, though the printing form may not exhibit advantages such as increased solid ink density.

EXAMPLES

In the following examples, all percentages are by weight unless otherwise noted. CYREL® photopolymerizable printing plates, CYREL® Digital Imager, CYREL® exposure unit, CYREL® processor, and CYREL® CYLOSOL developing solution are all available from The DuPont Company (Wilmington, Del.).

| Identifier | Ingredient | Manufacturer/Supplier |
|---|---|---|
| Vector 4111A | Linear triblock copolymer based on styrene and isoprene (SIS) with a polystyrene content of 18%. | Dexco Polymers |
| Polyoil 130 | Stereospecific, non-hydrolyzable liquid polybutadiene with approximately 1% vinyl double bonds | Degussa |
| HMDA | Hexanediol diacrylate | Sartomer |
| Photoinitiator | 2-phenyl 2,2-dimethyl oxyacetophenone | BASF |
| Syloid C 809 | Silica Matting Agent with an average particle size of 9 microns | W R Grace |
| Spheriglass A-5000 | Soda lime glass particles with a refractive index of 1.52 and a particle size of 11 microns | Potters Industries |

Examples 1 Through 5 and Comparative Example 1

A photopolymerizable mixture of about 65% of Vector 4111A, 15% of Polyoil, 15.75% of HMDA, 2% of the photoinitiator, and 2.25% of conventional additives (i.e., an antioxidant, a thermal inhibitor, a colorant dye, and uv absorbing dye) were mixed. The mixture was extruded and calendered to form a photopolymerizable element having a photopolymerizable layer between two polyethylene terephthalate (PET) films, which were a 5 mil (0.013 cm) support and a 5 mil (0.013 cm) silicon-coated PET coversheet. These preliminary photosensitive elements were stored for further use as described below.

Separately, each of the following mixtures were weighed into a polyethylene bottle and allowed to roll overnight resulting in the elastomeric binder (Vector 4111A) being dissolved in the toluene solvent and the particulate being evenly dispersed throughout the mixture.

A multilayer coversheet was prepared as follows. A polyethylene terephthalate film was coated with an actinic radiation opaque layer (which was also sensitive to infrared laser radiation) as disclosed in Example 1 of U.S. Pat. No. 6,238,837. For each sample, this coated film was then placed on a flat surface with the actinic radiation opaque layer facing upward, and one of the above mixtures was separately coated using a Multifilm applicator with a 10 mil gap to form a layer of mixture disposed above the actinic radiation opaque layer. The layer of the elastomeric binder and particulate was then allowed to dry, which removed the solvent. This produced a final coating weight of the elastomeric—particulate mixture of around 400 mg/dm$^2$ for each sample, with the elastomeric binder 75% and the particulate 25% by weight of the layer.

For each of Examples 1 through 5 and the Comparative Example 1, a printing form precursor was prepared by combining the preliminary photosensitive element and the multilayer cover element as follows. The silicon-coated PET coversheet of the above-mentioned preliminary photosensitive element was removed, and the multilayer cover element was laminated in place of the (removed) coversheet with the elastomeric layer in contact with the photopolymerizable layer of the photosensitive element. In addition, a Control sample was prepared by laminating the polyethylene terephthalate film that had the actinic radiation opaque layer, but without a layer of an elastomeric, particulate-containing composition, to the photopolymerizable layer of the photosensitive element. For the Control, the actinic radiation opaque layer contacted the photopolymerizable layer. Lamination was done using a Cromalin® Laminator set at a temperature of 275° F. The printing form precursors were then placed in an oven set at 60° C. overnight.

The above precursors were exposed to ultraviolet radiation at 365 nm for 70 seconds (1.2 Joules/cm$^2$) through the support side of the samples to form a floor, and were then imaged using a CYREL® Digital Imager infrared laser radiation exposure unit (CU Spark 2530 made by Esko Graphics Imaging GmbH having Nd:YAG laser (light wavelength output at 1064 nm) at 3.0 Joules/cm$^2$ of energy to selectively remove the actinic radiation opaque layer and form the in-situ mask image on the adjacent layer which in the Examples and Comparative Example was the elastomeric, particulate containing layer and for the Control was the photopolymerizable layer. Each of the precursors was then exposed through the in-situ mask to ultraviolet radiation at 365 nm for 8 minutes (8.1 Joules/cm2) on a CYREL® exposure unit.

After imagewise-exposure, the precursor was developed in a Cyrel® Processor 1000P with Cylosol®. The resulting printing plate was dried at 60° C. for 3 hours in a Cyrel®

| Ingredient | Example 1 | Example 2 | Example 3 | Example 4 | Example 5 | Comparative Example 1 |
|---|---|---|---|---|---|---|
| Vector 4111A | 18.75 | 18.75 | 18.75 | 18.75 | 18.75 | 18.75 |
| SUNPMMA-S50 | 6.25 | | | | | |
| Orgasol 2001 UD NAT 1 | | 6.25 | | | | |
| SPHERIGLASS A6000 | | | 6.25 | | | |
| Minex 7 | | | | 6.25 | | |
| Feldspar R500 | | | | | 6.25 | |
| Syloid C 809 | | | | | | 6.25 |
| Toluene | 75 | 75 | 75 | 75 | 75 | 75 |
| Total | 100 | 100 | 100 | 100 | 100 | 100 |

Dryer 1002 D and then simultaneously finished by UV-A and UV-C exposure in a CYREL® 3248 UNIT for 8 min.

Microscopic examination of all of the printing plates showed all of the 1% dots to be well-formed and present.

The finished plates were then cut to size and printed on a Mark Andy 830 press using a 700 LPI 2.3 bcm anilox roll at 180 feet per minute. Printing was done on white biaxially-oriented polypropylene label stock from Avery Dennison. Print density readings were then taken using an X-Rite 500 series densitometer. For halftone dots areas, the density readings were converted from density to % Dot using the Murray-Davis equation listed below.

$$\text{Apparent Dot area} = \frac{1 - 10^{D(t)-D(b)}}{1 - 10^{D(s)-D(b)}} * 100$$

where D(t)=Density of film tint,

D(s)=Density of solid, or D-Max,

D(b)=Density of film base

The results are shown in the table below. The solid ink density and the 1% dot density values shown are for multiple readings in those areas minus is the average density of the biaxially-oriented polypropylene. The average density of the biaxially-oriented polypropylene substrate was 0.06.

| Sample | Solid Ink Density | 1% Dot Density | 1% Dot Size | Particulate in Elastomer Layer |
|---|---|---|---|---|
| Example 1 | 1.18 | 0.06 | 13.82 | SUNPMMA-S50 |
| Example 2 | 1.46 | 0.07 | 15.42 | Orgasol 2001 UD NAT 1 |
| Example 3 | 1.42 | 0.06 | 13.41 | SPHERIGLASS A6000 |
| Example 4 | 1.41 | 0.07 | 15.49 | Minex 7 |
| Example 5 | 1.34 | 0.06 | 13.52 | Feldspar R500 |
| Comparative Example 1 | 1.33 | 0.11 | 23.47 | Syloid C 809 |
| Control | 1.11 | 0.06 | 13.99 | None- no elastomer layer |

As the results show, all of the plates had an increase in Solid Ink Density compared to the Control made without an elastomeric, particulate containing layer. It is also noteworthy that the 1% dot size readings of Examples 1 through 5 were in the general range of the Control. However, Comparative Example 1 had an unacceptable increase in 1% dot size. While not proscribing to a particular explanation, it is speculated that the larger difference in refractive index between the silica particles (n=1.46) and the elastomeric binder (n=1.52), which was 0.06 units, resulted in increased light scattering which adversely effected the 1% dot structure, particularly when compared to the difference in refractive index between the elastomeric binder and the particulate of Examples 1 through 5.

Comparative Example 2

In a separate experiment for Comparative Example 2, the same procedure as described for Examples 1 through 5 and Comparative Example 1 was followed to prepare a printing plate, except that the particulate incorporated into the layer of the elastomeric composition was Spheriglass A5000, having an average particle size of 11μ and a refractive index of 1.52. When printed on a different occasion, but using the same press and same setup as described above, the following results occurred.

| Sample | Solid Ink Density | 1% Dot Density | 1% Dot Size | Particle |
|---|---|---|---|---|
| Comparative Example 2 | 1.38 | 0.10 | 21.46 | Spheriglass A5000 |
| Control | 1.07 | 0.06 | 14.10 | None |

These results demonstrated that Comparative Example 2 had an increase in solid ink density, but, there was also an unacceptable increase in the 1% dot size. The printing plate of Comparative Example 2 was viewed microscopically, and it was observed that a fair number of the 1% dots in the printing plate had significant physical damage. While not proscribing to a particular explanation, it is speculated that the larger particle size, compared to the examples of this invention, resulted in physical damage to the 1% dots. This physical damage caused the excessive 1% dot size in the final print sample.

The invention claimed is:

1. A printing form precursor comprising:
   a) a layer of a photopolymerizable composition sensitive to actinic radiation, the composition comprising a binder, a monomer, and a photo initiator;
   b) a layer of an elastomeric composition, that is or becomes sensitive to the actinic radiation, comprising at least an elastomeric binder, and particulate, the elastomeric composition having an index of refraction;
   wherein the particulate is selected from polyamide, polymethylmethacrylate, feldspar, nepheline syenite, or glass particles, the particulate having an average diameter from 1 to 10 micron and an index of refraction that is ±0.04 of the index of refraction of the elastomeric composition; and
   c) an actinic radiation opaque layer on, adjacent, or disposed above the elastomeric layer b) opposite the photopolymerizable layer a), that is capable of forming an in-situ mask.

2. The printing form precursor of claim 1 wherein the particulate has a particle size distribution in which 99.7% of the particles is within 1 to 10 micron.

3. The printing form precursor of claim 1 wherein less than 2% of the particulate has a particle size greater than 10 micron.

4. The printing form precursor of claim 1 wherein less than 0.5% of the particulate has a particle size greater than 10 micron.

5. The printing form precursor of claim 1 wherein the average diameter of the particulate is from 2 to 9 micron.

6. The printing form precursor of claim 1 wherein the average diameter of the particulate is from 5 to 8 micron.

7. The printing form precursor of claim 1 wherein the particulate is polyamide.

8. The printing form precursor of claim 1 wherein the particulate is polymethylmethacrylate.

9. The printing form precursor of claim 1 wherein the particulate is feldspar.

10. The printing form precursor of claim 1 wherein the particulate is nepheline syenite.

11. The printing form precursor of claim 1 wherein the glass particulate is soda lime glass.

12. The printing form precursor of claim 1 wherein the particulate is from 5 to 40% by weight of the elastomeric composition.

13. The printing form precursor of claim 1 wherein the particulate is from 15 to 35% by weight and the elastomeric binder is from 85 to 65% by weight of the elastomeric composition.

14. The printing form precursor of claim 1 wherein the elastomeric binder is selected from thermoplastic block-copolymers comprising elastomeric block and non-elastomeric block.

15. The printing form precursor of claim 1 wherein the elastomeric composition has a refractive index from 1.52 to 1.54, and the particulate has a refractive index from 1.48 to 1.58.

16. The printing form precursor of claim 1 wherein the binder in the elastomeric composition may be the same or different from the binder in the photopolymerizable composition.

17. The printing form precursor of claim 1 wherein the elastomeric layer has a thickness from 1 to 10 mil.

\* \* \* \* \*